(12) United States Patent
Matsuda et al.

(10) Patent No.: US 9,730,320 B2
(45) Date of Patent: Aug. 8, 2017

(54) PREPREG, LAMINATE, METAL FOIL-CLAD LAMINATE, CIRCUIT BOARD AND LED MODULE

(75) Inventors: Takashi Matsuda, Fukushima (JP); Kiyotaka Komori, Fukushima (JP); Akiyoshi Nozue, Mie (JP); Takayuki Suzue, Mie (JP); Mitsuyoshi Nishino, Fukushima (JP); Toshiyuki Asahi, Osaka (JP); Naoyuki Tani, Osaka (JP); Yoshito Kitagawa, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 13/882,126

(22) PCT Filed: Oct. 27, 2011

(86) PCT No.: PCT/JP2011/006007
§ 371 (c)(1),
(2), (4) Date: Apr. 26, 2013

(87) PCT Pub. No.: WO2012/056703
PCT Pub. Date: May 3, 2012

(65) Prior Publication Data
US 2013/0215628 A1 Aug. 22, 2013

(30) Foreign Application Priority Data
Oct. 29, 2010 (JP) .................................. 2010-244145

(51) Int. Cl.
*H05K 1/03* (2006.01)
*C08J 5/24* (2006.01)
(Continued)

(52) U.S. Cl.
CPC ................. *H05K 1/038* (2013.01); *C08J 5/24* (2013.01); *C08K 3/0033* (2013.01); *C08K 3/22* (2013.01);
(Continued)

(58) Field of Classification Search
USPC ........... 362/382; 442/59, 232, 237; 174/254, 174/255
See application file for complete search history.

(56) References Cited

U.S. PATENT DOCUMENTS 3,956,212 A * 5/1976 Sakaguchi et al. ........... 524/399
6,054,509 A * 4/2000 Arai et al. .................... 523/428
(Continued)

FOREIGN PATENT DOCUMENTS

JP 62-173245 7/1987
JP 02-251442 10/1990
(Continued)

OTHER PUBLICATIONS

Effects of particle size, particle/matrix interface adhesion and particle loading on mechanical properties of particulate-polymer composites—Jan. 2008 Shao-Yun Fu a,, Xi-Qiao Feng b, Bernd Lauke c, Yiu-Wing Mai—cont'd on line V.*
(Continued)

*Primary Examiner* — Lynda Salvatore
(74) *Attorney, Agent, or Firm* — McDermott Will & Emery LLP

(57) ABSTRACT

A laminate with superior thermal conductivity, heat resistance, drill workability, and fire retardancy is provided. In a prepreg obtained by impregnating a woven or nonwoven fabric base with a thermosetting resin composition, the thermosetting resin composition contains 80 to 200 parts by volume of an inorganic filler per 100 parts by volume of a thermosetting resin, the inorganic filler contains (A) gibbsite
(Continued)

type aluminum hydroxide particles having an average particle diameter ($D_{50}$) of 2 to 15 μm and (B) magnesium oxide having an average particle diameter ($D_{50}$) of 0.5 to 15 μm, and a compounding ratio (volume ratio) of the gibbsite type aluminum hydroxide particles (A) to the magnesium oxide (B) is 1:0.3 to 3.

6 Claims, 2 Drawing Sheets

(51) Int. Cl.
C08K 3/00 (2006.01)
C08K 3/22 (2006.01)

(52) U.S. Cl.
CPC ... *H05K 1/0373* (2013.01); *C08K 2003/2217* (2013.01); *C08K 2003/2227* (2013.01); *H05K 1/0366* (2013.01); *H05K 2201/012* (2013.01); *H05K 2201/0209* (2013.01); *Y10T 442/20* (2015.04); *Y10T 442/3415* (2015.04); *Y10T 442/3472* (2015.04); *Y10T 442/656* (2015.04); *Y10T 442/659* (2015.04)

(56) References Cited

U.S. PATENT DOCUMENTS

| | | |
|---|---|---|
| 2002/0102206 A1 | 8/2002 | Brown et al. |
| 2003/0054152 A1 | 3/2003 | Brown et al. |
| 2003/0059367 A1 | 3/2003 | Brown et al. |
| 2003/0077482 A1 | 4/2003 | Brown et al. |
| 2010/0125116 A1 | 5/2010 | Shiobara et al. |
| 2010/0263919 A1 | 10/2010 | Lee et al. |
| 2011/0257300 A1 | 10/2011 | Nishi et al. |
| 2012/0228010 A1* | 9/2012 | Matsuda et al. ............ 174/254 |

FOREIGN PATENT DOCUMENTS

| | | |
|---|---|---|
| JP | 07-232405 | 9/1995 |
| JP | 2001-508002 A | 6/2001 |
| JP | 2003-201332 A | 7/2003 |
| JP | 04-209632 B2 | 1/2009 |
| JP | 2009-021469 A | 1/2009 |
| JP | 2010-000774 A | 1/2010 |
| JP | 2010-090182 A | 4/2010 |
| KR | 10-2008-0080674 A | 9/2008 |
| KR | 10-2010-0054740 A | 5/2010 |
| WO | 2007/132771 A1 | 11/2007 |
| WO | 2009/142192 A1 | 11/2009 |
| WO | WO-2010/070890 A1 | 6/2010 |

OTHER PUBLICATIONS http://image.sciencenet.cn/olddata/kexue.com.cn/upload/blog/file/2009/6/200966153544300673.*
International Search Report mailed Jan. 31, 2012 issued in corresponding International Application No. PCT/JP2011/006007.
Korean Office Action issued Korean Application No. 10-2013-7012841 dated Jun. 19, 2014.
Taiwanese Office Action and Search Report issued in Taiwanese Application No. 100139383 dated Mar. 28, 2014, w/Partial English Translation.

* cited by examiner

PREPREG, LAMINATE, METAL FOIL-CLAD LAMINATE, CIRCUIT BOARD AND LED MODULE

RELATED APPLICATIONS

This application is the U.S. National Phase under 35 U.S.C. §371 of International Application No. PCT/JP2011/006007, filed on Oct. 27, 2011, which in turn claims the benefit of Japanese Application No. 2010-244145, filed on Oct. 29, 2010, the disclosures of which Applications are incorporated by reference herein.

TECHNICAL FIELD

The present invention relates to a prepreg for use in the field of circuit boards for various electronic devices. In particular, the present invention relates to a prepreg which enables production of a laminate, a metal foil-clad laminate, a circuit board and an LED module with superior thermal conductivity, heat resistance, and the like.

BACKGROUND ART

A type of laminate designated FR-4 which is produced by laminate molding of a prepreg comprising a glass cloth impregnated with a resin component such as epoxy resin is being widely used as a typical laminate in printed wiring boards for electronic devices. The designation FR-4 is a classification according to standards set forth by the U.S. NEMA (National Electrical Manufacturers Association).

On the other hand, so-called CEM-3 type composite laminates are also known in which glass cloth impregnated with a resin component is laminated as a surface layer on both surfaces of a core layer of nonwoven cloth impregnated with a resin component. For example, Patent Document 1 proposes a composite laminate in which a resin varnish used in a core material contains a filler combining talc and aluminum hydroxide, a compounding ratio between talc and aluminum hydroxide is 0.15:1 to 0.65:1, and the aluminum hydroxide is a boehmite type aluminum hydroxide. In addition, Patent Document 2 describes a composite laminate containing an aluminum hydroxide with a molecular formula of $Al_2O_3 \cdot nH_2O$ (where n is a value greater than 2.6 and smaller than 2.9) in an amount of 200 wt % to 275 wt % of resin in an intermediate layer of the laminate.

Patent Document 1: Japanese Patent Application Laid-open No. S62-173245

Patent Document 2: Japanese Translation of PCT Application No. 2001-508002

As electronic devices have become lighter and more compact in recent years, electronic components are being mounted at higher densities on printed wiring boards (circuit boards). Such mounted electronic components may include a plurality of LEDs (light-emitting diodes) and the like that require heat dissipation. Conventional laminates problematically lack adequate heat dissipation properties as substrates for such purposes. Meanwhile, as far as mounting methods are concerned, reflow soldering and, in particular, reflow soldering using lead-free solder which requires a high-temperature reflow process has become the mainstream in the interest of reducing environmental impact. In a reflow soldering process using such lead-free solder, high heat resistance is required in order to suppress blistering and the like. Maintaining drill workability is also necessary. Furthermore, from a safety standpoint, fire retardancy satisfying the V-0 level as defined by the UL-94 standard is required.

However, there are no conventional laminates that simultaneously satisfy such thermal conductivity (heat dissipation properties), heat resistance, drill workability, and fire retardancy.

SUMMARY OF THE INVENTION

The present invention aims to address the problems described above, and an object of the present invention is to provide a prepreg which enables production of a laminate, a metal foil-clad laminate, a circuit board and an LED module with superior thermal conductivity, heat resistance, drill workability, and fire retardancy.

An aspect of the present invention is a prepreg obtained by impregnating a woven or nonwoven fabric base with a thermosetting resin composition, wherein: the thermosetting resin composition contains 80 to 200 parts by volume of an inorganic filler per 100 parts by volume of a thermosetting resin; the inorganic filler contains (A) gibbsite type aluminum hydroxide particles having an average particle diameter ($D_{50}$) of 2 to 15 μm and (B) magnesium oxide having an average particle diameter ($D_{50}$) of 0.5 to 15 μm; and a compounding ratio (volume ratio) of the gibbsite type aluminum hydroxide particles (A) to the magnesium oxide (B) is 1:0.3 to 3.

By using the prepreg configured as described above, a laminate with superior thermal conductivity, heat resistance, drill workability, and fire retardancy can be obtained. Compounding ordinary aluminum oxide with a thermosetting resin composition in order to increase thermal conductivity causes a significant decline in drill workability due to high hardness of aluminum oxide. The present invention significantly improves thermal conductivity without impairing drill workability by increasing thermal conductivity without compounding aluminum oxide particles.

Other aspects of the present invention relate to a laminate obtained by laminating and molding one or a plurality of sheets of the prepreg, a metal foil-clad laminate obtained by cladding a metal foil on at least one surface of the laminate, a circuit board obtained by forming a circuit on the metal foil-clad laminate, and an LED module comprising an LED element mounted on the circuit board.

According to the present invention, a laminate and a circuit board with superior thermal conductivity, heat resistance, drill workability, and flame retardancy can be obtained.

DESCRIPTION OF EMBODIMENTS

Hereinafter, an embodiment of the present invention will be described one component at a time.

<Prepreg>

Figure 1A:
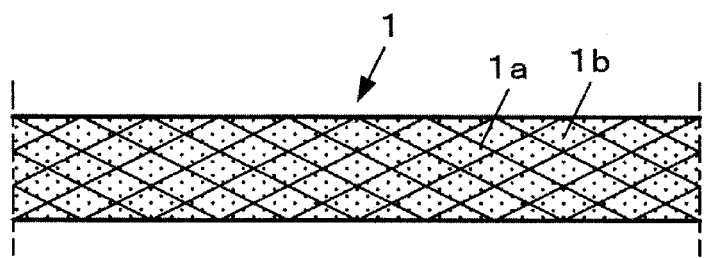
FIG. 1A is a schematic sectional view of a prepreg according to an embodiment of the present invention.

As shown in FIG. 1A, a prepreg 1 according to the present invention is obtained by impregnating a woven or nonwoven fabric base 1a with a thermosetting resin composition 1b.

[Woven Fabric Base]

The woven or nonwoven fabric base 1a which is impregnated with the thermosetting resin composition 1b in order to obtain the prepreg 1 is not particularly limited. Specific examples which may be used include: a glass cloth; and a synthetic fiber cloth using a synthetic fiber such as aramid fiber, polyester fiber, and nylon fiber, as well as various nonwoven fabric bases.

[Thermosetting Resin Composition]

Research conducted by the present inventors has revealed that heat dissipation properties of a laminate are improved when an aluminum hydroxide having superior thermal conductivity is compounded for the purpose of imparting heat dissipation properties to the laminate. Fire retardancy is also improved. However, compounding an excessive amount of aluminum hydroxide problematically results in a significant decline in heat resistance of the laminate, which makes the laminate more susceptible to blisters and the like during solder reflow. In addition, when compounding an aluminum oxide with superior heat dissipation properties in place of an aluminum hydroxide, problems arise in that excessive wear of drill blades during drilling necessitates the drill blades to be frequently replaced and that fire retardancy declines. Furthermore, when reducing a compounded amount of the aluminum oxide in order to suppress wear of the drill blades, a problem arises in that sufficient thermal conductivity cannot be obtained. As shown, it has been difficult to produce a laminate that simultaneously fulfills all of the following requirements: high thermal conductivity, high heat resistance, high drill workability, and high fire retardancy.

In order to address this problem, the present invention uses a resin composition containing 80 to 200 parts by volume of an inorganic filler per 100 parts by volume of a thermosetting resin, wherein the inorganic filler contains (A) gibbsite type aluminum hydroxide particles having an average particle diameter ($D_{50}$) of 2 to 15 μm and (B) magnesium oxide having an average particle diameter ($D_{50}$) of 0.5 to 15 μm, and a compounding ratio (volume ratio) of the gibbsite type aluminum hydroxide particles (A) to the magnesium oxide (B) is 1:0.3 to 3.

(Thermosetting Resin)

Specific examples of the thermosetting resin include epoxy resins; radical polymerizable thermosetting resins such as unsaturated polyester resins and vinyl ester resins; and other liquid thermosetting resins. In addition, a curing agent, a curing catalyst, or the like is compounded as necessary in the thermosetting resin. Furthermore, when using a radical polymerizable thermosetting resin, a radical polymerizable monomer such as styrene, diallyl phthalate or the like, various initiating reagents, and the like can be compounded as necessary. Moreover, a solvent may be compounded as necessary for the purpose of viscosity adjustment and productivity improvement.

The epoxy resin is not particularly limited as long as the epoxy resin constitutes various organic substrates which can be used to produce laminates and circuit boards. Specific examples include bisphenol A epoxy resin, bisphenol F epoxy resin, bisphenol S epoxy resin, aralkyl epoxy resin, phenol novolac epoxy resin, alkylphenol novolac epoxy resin, biphenol epoxy resin, naphthalene epoxy resin, dicyclopentadiene epoxy resin, epoxidized condensation products of phenol and an aromatic aldehyde having phenolic hydroxyl, triglycidyl isocyanurate, and alicyclic epoxy resin. Depending on the situation, one of these resins may be used independently or two or more of these resins may be used in combination.

In addition, the above epoxy resins having been brominated or phosphorus-modified (phosphorus-containing), a nitrogen-containing resin, a silicone-containing resin, and the like can be used in order to impart flame retardancy to the resin composition and, by extension, to a prepreg, a laminate, and a circuit board. Even in this case, one of these resins may be used independently or two or more of these resins may be used in combination as the situation requires. The use of halogen-based flame retardants is discouraged from an environmental perspective.

The curing agent that is compounded as necessary is not particularly limited. Specific examples include dicyandiamide, phenol-based hardeners, acid anhydride hardeners, aminotriazine novolak hardeners, and cyanate resin. Depending on the situation, one of these curing agents may be used independently or two or more of these curing agents may be used in combination.

(Inorganic Filler)

The inorganic filler according to the present embodiment contains gibbsite type aluminum hydroxide particles (A) and magnesium oxide (B).

The gibbsite aluminum hydroxide particles (A) are an aluminum compound represented by (Al(OH)$_3$) or (Al$_2$O$_3$·3H$_2$O), and are a component that imparts thermal conductivity, drill workability, and flame retardancy to the laminate in a balanced manner.

The gibbsite type aluminum hydroxide particles (A) have an average particle diameter ($D_{50}$) of 2 to 15 μm. When the average particle diameter ($D_{50}$) of the gibbsite type aluminum hydroxide particles (A) exceeds 15 μm, drill workability declines. On the other hand, when the average particle diameter ($D_{50}$) of the gibbsite type aluminum hydroxide particles (A) falls below 2 μm, thermal conductivity and heat resistance decline, which causes a decline in productivity.

Moreover, an average particle diameter ($D_{50}$) according to the present embodiment refers to a particle diameter at a 50% point on a cumulative curve of a powder group as determined by a laser diffraction particle size analyzer, provided that 100% represents a total volume of the powder group.

An average particle diameter ($D_{50}$) of magnesium oxide (B) is 0.5 to 15 μm and, preferably, 1 to 5 μm. When the average particle diameter ($D_{50}$) of the magnesium oxide particles exceeds 15 μm, drill workability declines. On the other hand, when the average particle diameter ($D_{50}$) of the magnesium oxide particles falls below 0.5 μm, thermal conductivity and productivity decline.

In addition, the magnesium oxide particles used in the present invention preferably has a specific surface area of 0.1 to 1.5 m$^2$/g. Magnesium oxide particles with a specific surface area equal to or below 1.5 m$^2$/g is advantageous in that no voids occur even when the inorganic filler is highly filled. On the other hand, a specific surface area equal to or below 0.1 m$^2$/g causes an average particle diameter to exceed 15 μm and is therefore unfavorable.

These resin compositions may contain a small amount (equal to or less than around 10% of a total amount of gibbsite type aluminum hydroxide particles and magnesium oxide) of other inorganic particles. Specific examples of such inorganic particles include: aluminum oxide (no water of crystallization); crystalline silica (no water of crystallization); inorganic nitrides such as boron nitride (no water of crystallization), aluminum nitride (no water of crystallization), and silicon nitride (no water of crystallization); inorganic carbides such as silicon carbide (no water of crystallization); natural minerals such as talc (release initiation temperature 950° C.), calcined kaolin (no water of crystallization), and clay (release initiation temperature 500 to 1,000° C.), and the like. Depending on the situation, one of these inorganic particles may be used independently or two or more of these inorganic particles may be used in combination. Among these inorganic particles, crystalline silica, talc, clay, and the like are particularly preferable due to superior thermal conductivity.

Moreover, a release initiation temperature of water of crystallization can be measured by thermogravimetric analysis (TGA) or differential scanning calorimetry (DSC).

An average particle diameter ($D_{50}$) of the other inorganic particles is 2 to 15 μm and preferably 3 to 10 μm. When the average particle diameter ($D_{50}$) of the inorganic particles exceeds 15 μm, a risk arises in that drill workability may decline.

A compounding ratio of the gibbsite type aluminum hydroxide particles (A) to the magnesium oxide (B) is 1:0.3 to 3 in volume ratio. When the compounded amount of the magnesium oxide (B) exceeds three times the compounded amount of the gibbsite aluminum hydroxide particles (A), drill workability and fire retardancy decline. On the other hand, when the compounded amount of the magnesium oxide (B) falls below 0.3 times the compounded amount of the gibbsite aluminum hydroxide particles (A), heat resistance declines.

(Others)

The compounding proportion of the inorganic filler per 100 parts by volume of the thermosetting resin is 80 to 200 parts by volume, preferably 100 to 180 parts by volumes, and more preferably 110 to 180 parts by volume. When the compounding proportion of the inorganic filler is less than 80 parts by volume, the thermal conductivity of the laminate declines. On the other hand, when the compounding proportion of the inorganic filler exceeds 200 parts by volume, the drill workability declines and, at the same time, manufacturability (resin impregnability, moldability) of the laminate also declines. In particular, when the compounding proportion of the gibbsite aluminum hydroxide particles (A) is too high or, more specifically, if the compounding proportion exceeds 100 parts by volume, heat resistance tends to decline due to the creation of a large amount of water of crystallization.

The thermosetting resin composition is prepared by a well-known preparation method in which an inorganic filler containing the gibbsite aluminum hydroxide particles (A) and the magnesium oxide (B) is compounded with a liquid thermosetting resin, and the thermosetting resin and the inorganic filler are homogeneously dispersed and mixed using a disperser, a ball mill, a roll, or the like. Moreover, an organic solvent for adjusting viscosity, various additives, and the like may also be compounded as necessary.

<Laminate>

Figure 1B:
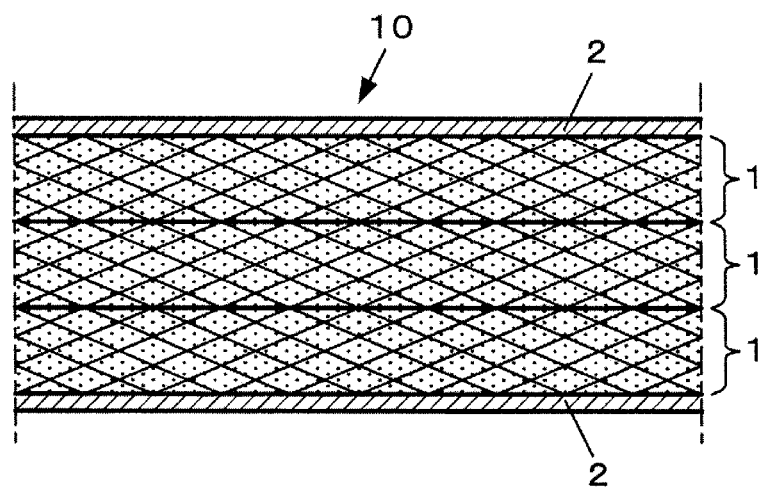
FIG. 1B is a schematic sectional view of a metal foil-clad laminate obtained by laminating and molding three sheets of the prepreg.

As shown in FIG. 1B, a laminate 10 according to the present invention is obtained by laminating and then molding a plurality of sheets of the prepreg 1 (in the illustrated example, three sheets). In particular, FIG. 1B illustrates a metal foil-clad laminate 10 in which both outer surfaces of the laminate are clad with metal foils 2. For example, the metal foil-clad laminate 10 as described above is prepared by laminating a plurality of sheets of the prepreg 1, laminating the metal foils 2 on both outer surfaces of the laminated sheets of the prepreg 1, and molding the obtained laminate under heat and pressure.

The metal foil is not particularly limited. Specifically, for example, copper foil, aluminum foil, nickel foil or the like may be preferably used.

Figure 1C:
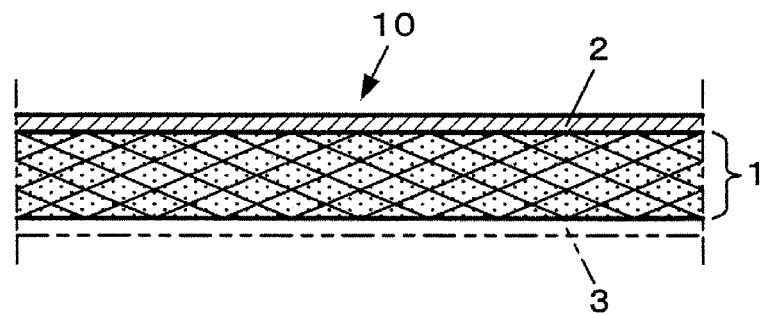
FIG. 1C is a schematic sectional view of a metal foil-clad laminate obtained by molding one sheet of the prepreg.

As shown in FIG. 1C, the laminate 10 according to the present invention may instead be obtained by molding only one sheet of the prepreg 1. The number of sheets of the prepreg 1 used and a thickness and a rigidity of the obtained laminate 10 may be adjusted as appropriate depending on a usage environment, required physical properties, and the like of the laminate 10 or the circuit board.

As also shown in FIG. 1C, alternatively, the metal foil 2 may be arranged only on one of the outer surfaces of the laminate 10. In this case, a release film 3 is laminated on a surface on which the metal foil 2 is not arranged (in the illustrated example, a lower surface) and molding is then performed under heat and pressure. The laminate 10 is used with the release film 3 removed.

With the prepreg 1 according to the present embodiment, since the gibbsite aluminum hydroxide particles (A) and the magnesium oxide (B) are compounded in predetermined amounts in the thermosetting resin composition, wear of the drill blade during drilling of the laminate 10 can be suppressed. As a result, drill life can be extended. In addition, when drilling is performed in order to form a through hole, since irregularities are less likely to form on an inner surface of the formed hole, the inner surface of the formed hole can be smoothly formed. Consequently, when a through hole is formed by hole-plating an inner surface of the hole, high conduction reliability can be imparted to the through hole. Furthermore, thermal conductivity can be imparted to the laminate 10 without significantly reducing the heat resistance and drill workability of the laminate 10.

<Circuit Board and LED Module>

A circuit board according to the present invention is obtained by forming a circuit on the metal foil-clad laminate 10 (processing the metal foil into a circuit). In addition, an LED module according to the present invention comprises the circuit board (more specifically, the circuit of the circuit board) mounted with an LED element.

Figure 2:
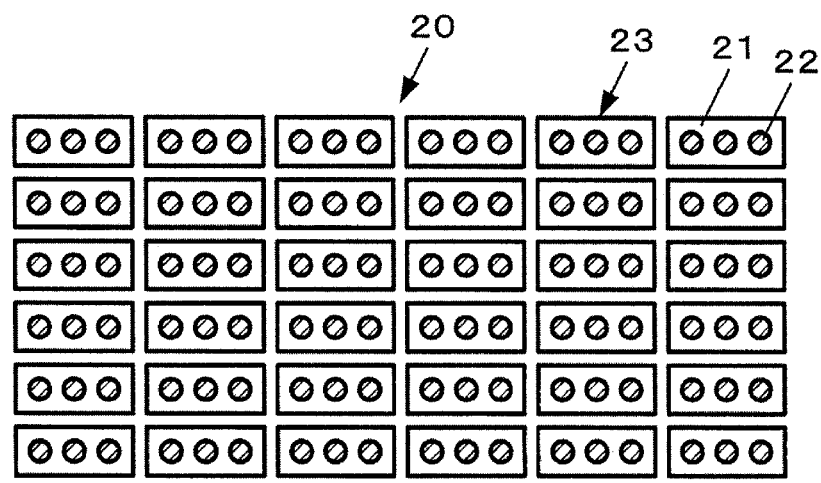
FIG. 2 is a schematic plan view of a backlight unit using an LED module according to an embodiment of the present invention.

Since a circuit board obtained using the prepreg 1 according to the present embodiment has superior thermal conductivity, drill workability, and the like, the circuit board can be preferably used in applications where high heat dissipation properties are required, such as printed wiring boards of LED backlight units including those mounted to liquid crystal displays and printed wiring boards for LED illumination. Specifically, as shown in the schematic plan view in FIG. 2, examples of LED applications include an LED backlight unit 20 mounted to a liquid crystal display. The LED backlight unit 20 shown in FIG. 2 is constituted by an array of a large number of LED modules 23 each comprising a plurality of (in the illustrated example, three) LEDs 22 mounted on a printed wiring board or, in other words, a circuit board 21, and is arranged on a rear surface of a liquid crystal panel to be used as a backlight of a liquid crystal display. Conventional mainstream liquid crystal displays have predominantly used cold-cathode tube (CCFL) type backlights as liquid crystal display backlights. However, in recent years, LED backlights units such as that described above have been actively developed since, compared to cold-cathode tube backlights, LED backlight units advantageously provide improved picture quality due to a broader color spectrum, a lower environmental impact because no mercury is used, and a higher thinning potential.

Generally, the LED modules 23 use more power than cold-cathode tubes and, consequently, generate more heat. The use of a circuit board obtained due to the prepreg 1 according to the present embodiment as the printed wiring board (circuit board) 21 which requires high heat dissipation properties significantly improves the problem of heat dissipation. Therefore, a luminous efficiency of the LED element can be improved.

As described above, an aspect of the present invention is a prepreg obtained by impregnating a woven or nonwoven fabric base with a thermosetting resin composition, wherein: the thermosetting resin composition contains 80 to 200 parts by volume of an inorganic filler per 100 parts by volume of a thermosetting resin; the inorganic filler contains (A) gibbsite type aluminum hydroxide particles having an average particle diameter ($D_{50}$) of 2 to 15 μm and (B) magnesium oxide having an average particle diameter ($D_{50}$) of 0.5 to 15 μm; and a compounding ratio (volume ratio) of the gibbsite type aluminum hydroxide particles (A) to the magnesium oxide (B) is 1:0.3 to 3.

By using the prepreg configured as described above, a laminate with superior thermal conductivity, heat resistance, drill workability, and fire retardancy can be obtained. Compounding ordinary aluminum oxide to a thermosetting resin composition in order to increase thermal conductivity significantly reduces drill workability. This is because hardness of aluminum oxide is high. The present invention significantly improves thermal conductivity without impairing drill workability by increasing thermal conductivity without compounding aluminum oxide particles.

The gibbsite aluminum hydroxide ($Al(OH)_3$ or $Al_2O_3 \cdot 3H_2O$) particles (A) which are an aluminum compound is a component that imparts thermal conductivity, drill workability, and flame retardancy to the laminate in a balanced manner. Since gibbsite type aluminum hydroxide potentially has properties for releasing water of crystallization at approximately 200 to 230° C., an effect of imparting flame retardancy is particularly high. However, an excessively high compounding ratio causes blisters and the like during solder reflow.

The magnesium oxide particles as the inorganic component (B) contribute toward imparting thermal conductivity and heat resistance to the laminate.

In the present invention, by using an inorganic filler which compounds gibbsite type aluminum hydroxide particles (A) having a predetermined average particle diameter ($D_{50}$) and magnesium oxide particles (B) having a predetermined average particle diameter ($D_{50}$) at a ratio of 1:0.3 to 3 in volume ratio, a prepreg is provided which enables production of a laminate combining superior thermal conductivity, superior heat resistance, superior drill workability, and superior flame retardancy.

A laminate obtained using such a prepreg can be preferably used in various circuit boards which require high heat dissipation, and can be particularly preferably used in LED-mounted circuit boards (which refers to LED module circuit boards in which an LED element is mounted on a circuit board; the same shall apply hereinafter) on which a large number of LEDs that generate large quantities of heat are mounted. When various electronic components are surface-mounted on a printed wiring board comprising such a laminate, the metal foil is less likely to blister even at a temperature of around 260° C., which is a reflow temperature of lead-free solder.

The gibbsite aluminum hydroxide particles (A) are preferably a composition of first gibbsite aluminum hydroxide particles having an average particle diameter ($D_{50}$) of 2 to 10 μm and second gibbsite aluminum hydroxide particles having an average particle diameter ($D_{50}$) of 10 to 15 μm. Since this configuration enables the inorganic filler to be more densely filled, a laminate with particularly superior thermal conductivity is obtained.

Furthermore, the magnesium oxide particles (B) preferably have a specific surface area of 0.1 to 1.5 $m^2/g$. This is because magnesium oxide particles having a specific surface area within this range advantageously prevent the occurrence of voids even when the inorganic filler is highly filled.

Moreover, other aspects of the present invention relate to a laminate obtained by laminating and molding one or a plurality of sheets of the prepreg, a metal foil-clad laminate obtained by cladding a metal foil on at least one surface of the laminate, a circuit board obtained by forming a circuit on the metal foil-clad laminate, and an LED module comprising an LED element mounted on the circuit board.

A laminate and a circuit board obtained due to the prepreg are superior in heat resistance, fire retardancy, and drill workability, and particularly superior in heat dissipation properties. Therefore, the circuit board may be preferably used as an electronic component-mounted circuit board which requires heat dissipation such as an LED-mounted circuit board. In other words, the circuit board may be preferably used as an LED module circuit board in which an LED element is mounted on a circuit board. Such an LED module using a circuit board with superior heat dissipation properties can be stably used over a long period of time.

EXAMPLES

Hereinafter, the present invention will be explained in further detail by means of examples. However, the present invention is not in any way limited by the examples.

Example 1

[Synthesis of Phosphorus-Containing Epoxy Resin]

First, as a thermosetting resin of a thermosetting resin composition used in a prepreg, a phosphorus-containing epoxy resin (phosphorus-modified epoxy resin) was synthesized as follows. Specifically, 130 parts by weight of HCA (9,10-dihydro-9-oxa-10-phosphaphenanthrene-10-oxide) and 400 parts by weight of xylene as a reaction solvent were placed in a four-necked glass separable flask equipped with an agitator, a thermometer, a cooling tube and a nitrogen gas introduction unit, and were heated and dissolved. Then, 94 parts by weight of 1,4-naphthoquinone were added in several batches with careful attention to a rise in temperature caused by reaction heat. At this point, the ratio of HCA that is a phosphorous compound was 1.02 moles per 1 mole of 1,4-napthoquinone. After reaction, 300 parts by weight of the solvent was collected. Subsequently, 350 parts by weight of EPPN-501H (trifunctional epoxy resin, epoxy equivalent=165 g/eq, manufactured by Nippon Kayaku Co., Ltd.), 250 parts by weight of Epotohto ZX-1355 (1,4-dihydroxynaphthalene epoxy resin, epoxy equivalent=145 g/eq, manufactured by Tohto Kasei Co., Ltd.) and 176 parts by weight of Epotohto YDF-170 (bisphenol F epoxy resin, epoxy equivalent=168 g/eq, manufactured by Tohto Kasei Co., Ltd.) were loaded, and the mixture was heated and agitated while introducing nitrogen gas to further collect the solvent. Triphenylphosphine (0.22 parts by weight) as a catalyst were added and reacted for 4 hours at 160° C. The obtained epoxy resin was 42.6 wt %, the epoxy equivalent was 273.5 g/eq, and the phosphorous content was 1.85 wt %.

[Preparation of Prepreg]

As shown in Table 1, 30 parts by volume of (A) gibbsite aluminum hydroxide (manufactured by Sumitomo Chemical Co., Ltd., $D_{50}$=5.4 μm) and 70 parts by volume of magnesium oxide ($D_{50}$=2.0 μm, specific surface area 1.0 m²/g) were compounded per 100 parts by volume of a thermosetting resin component of a thermosetting resin varnish containing a phosphorous-containing epoxy resin prepared as described above and a dicyandiamide (Dicy) curing agent, and were uniformly dispersed and mixed using a disperser. A prepreg was obtained by impregnating a glass cloth (manufactured by Nitto Boseki Co., Ltd.) with a weight per unit area of 47 g/m² and a thickness of 53 μm with the obtained thermosetting resin composition (a resin varnish compounded with an inorganic filler). The cloth content was 12 vol %.

[Production of Laminate]

A copper foil-clad laminate with a thickness of 0.8 mm was obtained by laminating six sheets of the obtained prepreg, placing a 0.018 mm-thick copper foil over both outer surfaces of the laminate, sandwiching the obtained laminate between two metal plates, and performing molding under heat and pressure at a temperature of 180° C. and pressure of 30 kg/m².

[Evaluation Test]

The obtained copper foil-clad laminate was evaluated for thermal conductivity, 220° C. oven heat resistance, 260° C. solder heat resistance, pressure cooker test performance, drill wear rate, and fire retardancy under the following evaluation conditions. Results were as shown in Table 1. It should be noted that the numerical values in the prepreg composition field in Table 1 are based on volume.

(Thermal Conductivity)

The copper foil was peeled from the obtained copper film-clad laminate, and the laminate without the copper foil was measured for density by a water displacement method, for specific heat by DSC (differential scanning calorimetry), and for thermal diffusivity by a laser flash method. Thermal conductivity was then calculated according to Expression 1.

Thermal conductivity (W/m·K)=density (kg/m³)× specific heat (kJ/kg·K)×thermal diffusivity (m²/S)×1000  (Formula 1)

(220° C. Oven Heat Resistance Test)

Test pieces prepared in accordance with JIS C 6481 using the obtained copper film-clad laminate were treated for 1 hour in a 220° C. thermostatic tank with an air circulator, and subsequently graded as "good" when neither blistering nor peeling occurred on the copper foil and the laminate or graded as "poor" if either blistering or peeling occurred.

(260° C. Solder Heat Resistance Test)

Test pieces prepared in accordance with JIS C 6481 using the obtained copper film-clad laminate were dipped in a 260° C. solder bath for 180 seconds, and a maximum period of time during which neither blistering nor peeling occurred on the copper foil and the laminate was determined. In the table, "180" denotes "180 seconds or more".

(Drill Wear Rate)

A wear rate of a drill blade after drilling 1,000 holes with a drill (drill diameter 0.3 mm) at a rate of 160,000 rpm into a laminate of two sheets of the obtained copper film-clad laminate was evaluated as a ratio (percentage) of an area of the drill blade worn due to drilling to an area of the drill blade prior to drilling.

(Fire Retardancy)

The obtained copper film-clad laminate was cut to a predetermined size and subjected to a combustion test in accordance with UL-94 combustion test methods, and evaluated.

Examples 2 to 10 and Comparative Examples 1 to 9

Prepregs were prepared in a similar manner to Example 1 with the exception of constitutions of the thermosetting resin composition being varied as shown in Tables 1 and 2, and copper film-clad laminates were produced and evaluated. Table 1 shows results of Examples 2 to 10, while Table 2 shows results of Comparative Examples 1 to 9. In the evaluation field of the comparative examples, underlined data denote data inferior to the Example.

Materials used were as follows.

Gibbsite type aluminum hydroxide particles (manufactured by Sumitomo Chemical Co., Ltd., $D_{50}$=2.0 μm)
Gibbsite type aluminum hydroxide particles (manufactured by Sumitomo Chemical Co., Ltd., $D_{50}$=1.0 μm)
Gibbsite type aluminum hydroxide particles (manufactured by Sumitomo Chemical Co., Ltd., $D_{50}$=15 μam)
Magnesium oxide ($D_{50}$=2.0 μm, specific surface area 1.0 m²/g)
Magnesium oxide ($D_{50}$=5.0 μm, specific surface area 2.5 m²/g)
Magnesium oxide ($D_{50}$=0.5 μm, specific surface area 3.5 m²/g)
Magnesium oxide ($D_{50}$=15.0 μm, specific surface area 0.2 m²/g)
Magnesium oxide ($D_{50}$=25.0 μm, specific surface area 0.1 m²/g)
Aluminum nitride with average particle diameter ($D_{50}$) of 6.6 μm (manufactured by Furukawa Denshi Co., Ltd.)
Boehmite with average particle diameter ($D_{50}$) of 5.5 μm
Aluminum oxide particles (alumina) with average particle diameter ($D_{50}$) of 4 μm (manufactured by Sumitomo Chemical Co., Ltd.)

TABLE 1

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Composition | (A1) aluminum hydroxide (5.4μ) | 30 | 70 | 54 | 90 | 30 | 90 | 70 | | | 30 |
| | (A2) aluminum hydroxide (2.0μ) | | | | | | | | | 30 | |
| | (A3) aluminum hydroxide (1.0μ) | | | | | | | | | | |
| | (A4) aluminum hydroxide (15μ) | | | | | | | | 70 | | |
| | (B1) MgO (5μ, BET 2.5 m²/g) | — | — | — | — | 70 | 90 | | | 70 | |
| | (B2) MgO (2μ, BET 1.0 m²/g) | 70 | 30 | 126 | 90 | — | — | | | | |
| | (B3) MgO (0.5μ, BET 3.5 m²/g) | | | | | | | 30 | 30 | | |

TABLE 1-continued

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Example | (B4) MgO (15μ, BET 0.2 m²/g) | | | | | | | | | | |
| | (B5) MgO (25μ, BET 0.1 m²/g) | | | | | | | | | | 70 |
| | Aluminum nitride (6.6μ) | — | — | — | — | — | — | | | | |
| | Boehmite (5.5μ) | — | — | — | — | — | — | | | | |
| | Alumina (4μ) | — | — | — | — | — | — | | | | |
| | Inorganic filler (parts by volume) | 100 | 100 | 180 | 180 | 100 | 180 | 100 | 100 | 100 | 100 |
| | Epoxy resin (parts by volume) | 100 | 100 | 100 | 100 | 100 | 100 | 100 | 100 | 100 | 100 |
| | Cloth content (vol %) | 12 | 12 | 12 | 12 | 12 | 12 | 12 | 12 | 12 | 12 |
| | Thermal conductivity | 1.4 | 1.3 | 2 | 1.9 | 1.4 | 1.9 | 1.1 | 1.3 | 1.2 | 1.5 |
| | Oven heat resistance [° C.] | Good | Good | Good | Good | Good | Good | Good | Good | Good | Good |
| | 260° C. solder heat resistance [sec] | 180 | 180 | 180 | 180 | 180 | 180 | 180 | 180 | 180 | 180 |
| | Drill wear (1,000 hits) | 55 | 42 | 70 | 65 | 55 | 65 | 30 | 35 | 50 | 75 |
| | Fire retardancy | V-0 | V-0 | V-0 | V-0 | V-0 | V-0 | V-0 | V-0 | V-0 | V-0 |
| | Voids | None | None | None | None | None | Yes | None | None | None | None |

TABLE 2

| | | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 |
|---|---|---|---|---|---|---|---|---|---|---|
| Composition | (A1) aluminum hydroxide (5.4μ) | — | 95 | 30 | 30 | 30 | 20 | 30 | | 30 |
| | (A2) aluminum hydroxide (2.0μ) | | | | | | | | | |
| | (A3) aluminum hydroxide (1.0μ) | | | | | | | | 30 | |
| | (A4) aluminum hydroxide (15μ) | | | | | | | | | |
| | (B1) MgO (5μ, BET 2.5 m²/g) | 100 | — | — | — | — | — | — | | — |
| | (B2) MgO (2μ, BET 1.0 m²/g) | — | 5 | — | — | — | 80 | — | 70 | 70 |
| | (B3) MgO (0.5μ, BET 3.5 m²/g) | | | | | | | | | |
| | (B4) MgO (15μ, BET 0.2 m²/g) | | | | | | | | | |
| | (B5) MgO (25μ, BET 0.1 m²/g) | | | | | | | 70 | | |
| | Aluminum nitride (6.6μ) | — | — | — | 70 | — | | | | — |
| | Boehmite (5.5μ) | — | — | — | — | 70 | | | | — |
| | Alumina (4μ) | — | — | 70 | — | — | | | | — |
| | Inorganic filler (parts by volume) | 100 | 100 | 100 | 100 | 100 | 100 | 100 | 100 | 250 |
| | Epoxy resin (parts by volume) | 100 | 100 | 100 | 100 | 100 | 100 | 100 | 100 | 100 |
| Example | Cloth content (vol %) | 12 | 12 | 12 | 12 | 12 | 12 | 12 | 12 | 12 |
| | Thermal conductivity | 1.4 | 1.1 | 1.3 | 1.6 | 1.2 | 1.4 | 1.6 | 1.2 | 2 |
| | Oven heat resistance [° C.] | Good | Poor | Good | Good | Good | Good | Good | Poor | Poor |
| | 260° C. solder heat resistance [sec] | 180 | 106 | 180 | 180 | 180 | 180 | 180 | 40 | 30 |
| | Drill wear (1,000 hits) | 60 | 23 | 100 | 100 | 50 | 57 | 80 | 50 | 65 |
| | Fire retardancy | Fail | V-0 | V-0 | V-0 | V-0 | Fail | V-0 | V-0 | V-0 |
| | Voids | None | None | None | None | None | None | None | Yes | Yes |

As is apparent from Table 1, Examples 1 to 10 all achieved high thermal conductivity and superior heat resistance in all tests. The drill wear rates were 70% or lower. Flame retardancy was at the V-0 level. In addition, a comparison between Example 4 and Example 6 further revealed that voids do not occur even if the inorganic filler is highly filled when a specific surface area of the magnesium oxide is within a range according to the present invention.

Furthermore, Examples 1 to 6, 8, and 10 which used magnesium oxide and/or gibbsite type aluminum hydroxide with a relatively large average particle diameter ($D_{50}$) produced particularly high levels of thermal conductivity of 1.3 (W/m·K) or higher. Moreover, Examples 7 to 9 which used magnesium oxide and/or gibbsite type aluminum hydroxide with a relatively small average particle diameter ($D_{50}$) produced particularly low levels of drill wear.

On the other hand, as is apparent from the results of the comparative examples shown in Table 2, flame retardancy could not be obtained when gibbsite type aluminum hydroxide was not included (Comparative Example 1), and thermal conductivity, heat resistance, and the like declined when a compounding ratio of gibbsite type aluminum hydroxide and magnesium oxide was 0.95:0.05 (Comparative Example 2). In addition, when alumina was included as an inorganic filler (Comparative Example 3), when aluminum nitride was included as an inorganic filler (Comparative Example 4), and when boehmite was included as an inorganic filler (Comparative Example 5), either thermal conductivity declined or drill wear increased significantly.

Furthermore, flame retardancy was inferior when a compounding ratio of gibbsite type aluminum hydroxide and magnesium oxide was 1:4 (Comparative Example 6), and drill wear exceeded 70% when magnesium oxide with an average particle diameter ($D_{50}$) of over 15 μm was used (Comparative Example 7). Moreover, when gibbsite type aluminum hydroxide particles with an average particle diameter ($D_{50}$) of less than 2 μm was used (Comparative Example 8), heat resistance was poor and, in addition, voids occurred.

Similarly, with Comparative Example 9 in which 250 parts by volume of the inorganic filler were compounded per 100 parts by volume of the thermosetting resin, heat resistance was poor and, in addition, voids occurred.

This application claims the benefit of Japanese Patent Application No. 2010-244145, filed Oct. 29, 2010, the disclosure of which is incorporated herein in its entirety.

While the present invention has been adequately described above through an embodiment with reference to the drawings as a representation of the present invention, it is to be understood that modifications and/or variations of the embodiment described above will be apparent to those skilled in the art. Therefore, it is construed that modifications and improvements made by those skilled in the art are to be covered by the spirit and scope of the following claims as long as such modifications and improvements do not constitute departures from the spirit and scope of the following claims.

INDUSTRIAL APPLICABILITY

The present invention provides a prepreg which enables production of a laminate, a metal foil-clad laminate, a circuit board and an LED module with superior thermal conductivity, heat resistance, drill workability and fire retardancy, and offers the promise of wide-ranging industrial applicability in the technical field of circuit boards for various electronic devices.

EXPLANATION OF REFERENCE NUMERALS

1 prepreg
1a woven or nonwoven fabric base
1b thermosetting resin composition
2 metal foil
3 release film
10 laminate, metal foil-clad laminate
20 LED backlight unit
21 circuit board (LED-mounted circuit board)
22 LED element
23 LED module

The invention claimed is:

1. A prepreg obtained by impregnating a woven or nonwoven fabric base with a thermosetting resin composition, wherein:
   the thermosetting resin composition contains 80 to 200 parts by volume of an inorganic filler per 100 parts by volume of a thermosetting resin;
   the inorganic filler contains (A) gibbsite type aluminum hydroxide particles having an average particle diameter ($D_{50}$) of 2 to 15 μm and (B) magnesium oxide having an average particle diameter ($D_{50}$) of 0.5 to 15 μm;
   a compounding ratio (volume ratio) of the gibbsite type aluminum hydroxide particles (A) to the magnesium oxide (B) is 1:0.3 to 3, and
   the inorganic filler does not contain aluminum oxide particles.

2. The prepreg according to claim 1, wherein a specific surface area of the magnesium oxide (B) is 0.1 to 1.5 m²/g.

3. A laminate obtained by laminating and molding one or a plurality of sheets of the prepreg according to claim 1.

4. A metal foil-clad laminate obtained by cladding a metal foil on at least one surface of the laminate according to claim 3.

5. A circuit board obtained by forming a circuit on the metal foil-clad laminate according to claim 4.

6. An LED module comprising an LED element mounted on the circuit board according to claim 5.

* * * * *